United States Patent [19]
Sakamoto et al.

[11] Patent Number: 5,612,656
[45] Date of Patent: Mar. 18, 1997

[54] RESONATOR WITH SPIRAL-SHAPED PATTERN ELECTRODES

[75] Inventors: Yukio Sakamoto; Toshimi Kaneko; Kazuo Dougauchi; Masahiko Kawaguchi; Katsuji Matsuta, all of Nagaokakyo, Japan

[73] Assignee: Murata Manufacturing Co., Ltd., Japan

[21] Appl. No.: 621,902

[22] Filed: Mar. 26, 1996

Related U.S. Application Data

[63] Continuation of Ser. No. 361,317, Dec. 21, 1994, abandoned.

[30] Foreign Application Priority Data

Dec. 24, 1993 [JP] Japan ................................ 5-347461

[51] Int. Cl.⁶ .............................. H03H 7/00; H01P 7/00
[52] U.S. Cl. ......................... 333/204; 333/185; 333/175
[58] Field of Search ................................. 333/202, 203, 333/204, 205, 185, 175, 219, 246; 336/200

[56] References Cited

U.S. PATENT DOCUMENTS

| | | | |
|---|---|---|---|
| 5,237,296 | 8/1993 | Mandai et al. | 333/161 |
| 5,300,903 | 4/1994 | Okamura et al. | 333/204 |
| 5,357,227 | 10/1994 | Tonegawa et al. | 333/185 |
| 5,400,000 | 3/1995 | Okamura et al. | 333/175 |
| 5,404,118 | 4/1995 | Okamura et al. | 333/175 |

*Primary Examiner*—Benny T. Lee
*Assistant Examiner*—David H. Vu
*Attorney, Agent, or Firm*—Ostrolenk, Faber, Gerb & Soffen, LLP

[57] ABSTRACT

A resonator 10 includes a first dielectric substrate 12. An earth electrode 14 is formed almost entirely on one main surface of the first dielectric substrate 12. A first pattern electrode 16 and a first drawing electrode 18 are formed on the other main surface of the first dielectric substrate 12. The first pattern electrode 16 and the first drawing electrode 18 are covered with an insulation layer 20. A second pattern electrode 22 and a second drawing electrode 24 are formed on the insulation layer 20. The second pattern electrode 22 and the second drawing electrode 24 are covered with a protecting layer 26. The earth electrode 14 is covered with a protecting layer 28. The earth electrode 14, the first pattern electrode 16 and the second pattern electrode 22 are connected with each other through a terminal electrode 30a. Terminal electrodes 30b and 30c are connected to the earth electrode 14. A drawing terminal electrode 32 is connected to the first drawing electrode 18 and the second drawing electrode 24.

6 Claims, 17 Drawing Sheets

10

RESONATOR WITH SPIRAL-SHAPED PATTERN ELECTRODES

This is a Continuation of application Ser. No. 08/361,317 filed on Dec. 21, 1994 now abandoned.

BACKGROUND OF THE INVENTION

1. Field of the Invention

The present invention relates to a resonator, and more particularly to a resonator of ¼ wavelength which has a pattern electrode and used in a chip type filter.

2. Description of the Prior Art

FIG. 17 is a perspective view showing an example of a conventional resonator. The resonator includes a dielectric substrate 1. An earth electrode 2 is formed almost entirely on one main surface of the dielectric substrate 1. A straight pattern electrode 3 is formed on the other main surface of the dielectric substrate 1 so as to be opposite to the earth electrode 2. One end of the pattern electrode 3 is connected to the earth electrode 2 via an end face of the dielectric substrate 1. A micro strip line is formed of the dielectric substrate 1, the earth electrode 2 and the pattern electrode 3.

FIG. 18 is a perspective view showing an example of a conventional chip type filter. The chip type filter includes a dielectric substrate 1. An earth electrode 2 is formed almost entirely on one main surface of the dielectric substrate 1. Two straight pattern electrodes 3a and 3b are formed on the other main surface of the dielectric substrate 1 so as to be opposite to the earth electrode 2. One end of each of the pattern electrodes 3a and 3b is connected to the earth electrode 2 via an end face of the dielectric substrate 1. The pattern electrodes 3a and 3b are formed so as to be parallel with each other and electromagnetically connected with each other. Drawing electrodes 4a and 4b are formed from the pattern electrodes 3a and 3b toward both ends of the dielectric substrate 1, respectively. Each of the drawing electrodes 4a and 4b is formed with a fixed interval spaced from one end of each of the pattern electrodes 3a and 3b connected to the earth electrode 2. In the chip type filter, a filter is constituted of an electromagnetic connection between two micro strip lines.

In each of the resonator shown in FIG. 17 and the chip type filter shown in FIG. 18, it is desired to increase Q without enlarging in a plan configuration.

Each of the length L of the pattern electrode of the resonator shown in FIG. 17 and the length L of the pattern electrode of the chip type filter shown in FIG. 18 is shown by the following equation (1).

$$L = \lambda/(4\, \epsilon_{re}^{1/2}) \tag{1}$$

where $\lambda$ is a wavelength, and $\epsilon_{re}$ is the effective dielectric constant of the dielectric substrate. As shown in the equation (1), in order to miniaturize the resonator and the chip type filter, it is conceivable to use a dielectric substrate having a high dielectric constant. However, in consideration of its temperature characteristic, it is impossible that the dielectric substrate has a very large dielectric constant. The upper limit of the dielectric constant $\epsilon_r$ of the dielectric substrate is approximately 100. Supposing that the dielectric constant can be replaced with the effective dielectric $\epsilon_{re}$, the length L of the pattern electrode in the resonator and the chip type filter of 1 GHz is calculated as long as 7.5 mm from the equation (1). Thus, it is difficult to miniaturize a resonator and a chip type filter of a high frequency band, for example, 1 GHz–3 GHz. In a chip type filter having a plurality of pattern electrodes electromagnetically connected with each other, the electromagnetic connection therebetween becomes greater as the lengths of the pattern electrodes increase. Thus, it is necessary to enlarge the interval between the pattern electrodes, which causes the chip type filter to be very large.

Then, a resonator and a chip type filter can be miniaturized are devised.

FIG. 19 is an exploded perspective view showing an example of a resonator which can be miniaturized and is the background of the present invention. In the resonator shown in FIG. 19, compared with the resonator shown in FIG. 17, the pattern electrode 3 is spirally formed. The pattern electrode 3 is formed so that the width thereof becomes stepwise smaller from the outermost end connected to the earth electrode 2 toward the innermost end opened.

FIG. 20 is an exploded perspective view showing an example of a chip type filter which can be miniaturized and is the background of the present invention. In the chip type filter shown in FIG. 20, compared with the chip type filter shown in FIG. 18, two pattern electrodes 3a and 3b are spirally formed so that the widths thereof become stepwise smaller from the outermost ends connected to the earth electrode 2 toward the innermost ends opened.

The resonator shown in FIG. 19 and the chip type filter shown in FIG. 20 can be miniaturized, because the pattern electrodes are spirally formed. Further, the resonator and the chip type filter have a high Q, respectively. Because, in the resonator and the chip type filter, the electric current distribution becomes smaller from one end of the pattern electrode on the earth electrode side toward the other end thereof opened, whereas the width of the pattern electrode becomes smaller from one end thereof toward the other end thereof. Thus, it is possible to obtain a resistance corresponding to the electric current distribution.

However, in the resonator shown in FIG. 19 and the chip type filter shown in FIG. 20, in accordance with miniaturizing, the width of the pattern electrode is reduced, and Q can not be further increased. Because, in the resonator and the chip type filter of high frequency band, electric current is concentrated on the surface of conductor such as the pattern electrode due to skin effect, and hence, the resistance component of the pattern electrode becomes high as a result of the reduction in the width of the pattern electrode.

SUMMARY OF THE INVENTION

Therefore, it is a primary object of the present invention to provide a resonator having a high Q without enlarging a plan configuration.

A resonator according to the present invention is a resonator having pattern electrodes wherein the pattern electrodes are formed in two or more layers so as to sandwich an insulation layer therebetween.

Because the pattern electrodes of the resonator are formed in a plurality of layers so as to sandwich the insulation layer therebetween, the surface area of the pattern electrodes is increased, the resistance component of the pattern electrodes is decreased. Accordingly, the resonator according to the present invention has a high Q even if the plan configuration of the resonator according to the present invention is the same as that of the conventional one.

According to the present invention, a resonator having a high Q can be obtained without enlarging a plan configuration.

The above and other objects, features, aspects and advantages of the present invention will become more apparent from the following detailed description of the embodiments with reference to the accompanying drawings.

DESCRIPTION OF THE PREFERRED EMBODIMENTS

Figure 1:
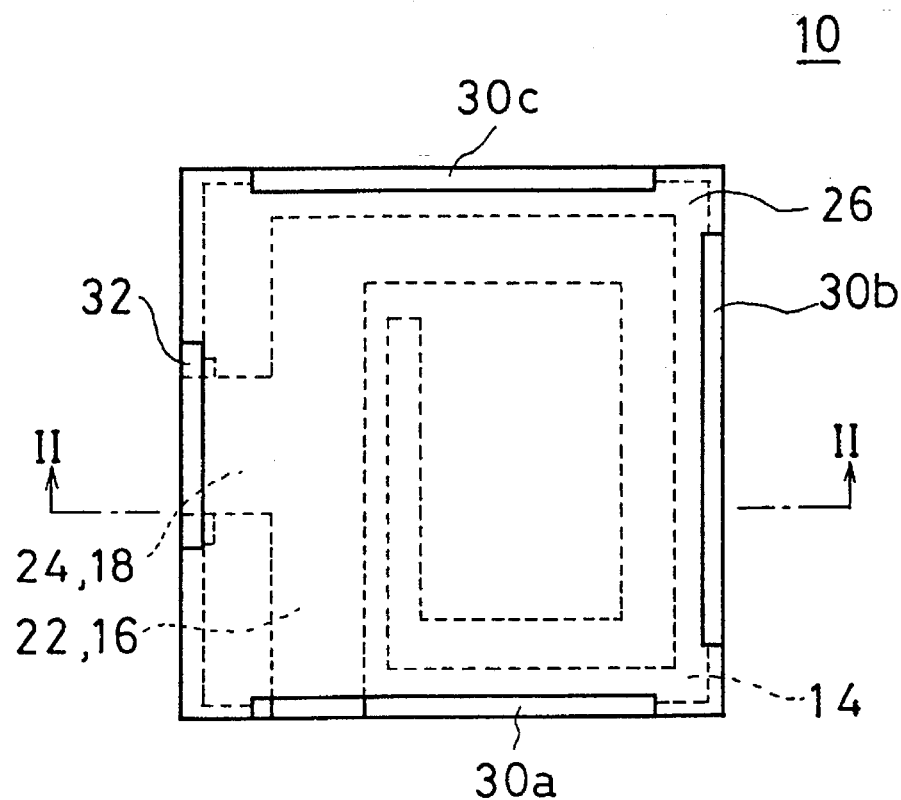
FIG. 1 is a plan view showing one example of a resonator according to the present invention.
Figure 2:
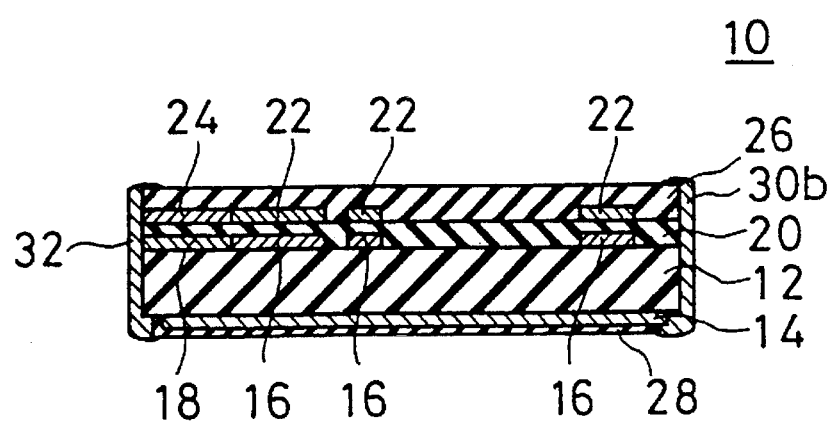
FIG. 2 is a sectional view taken along the line II—II of FIG. 1.
Figure 3:
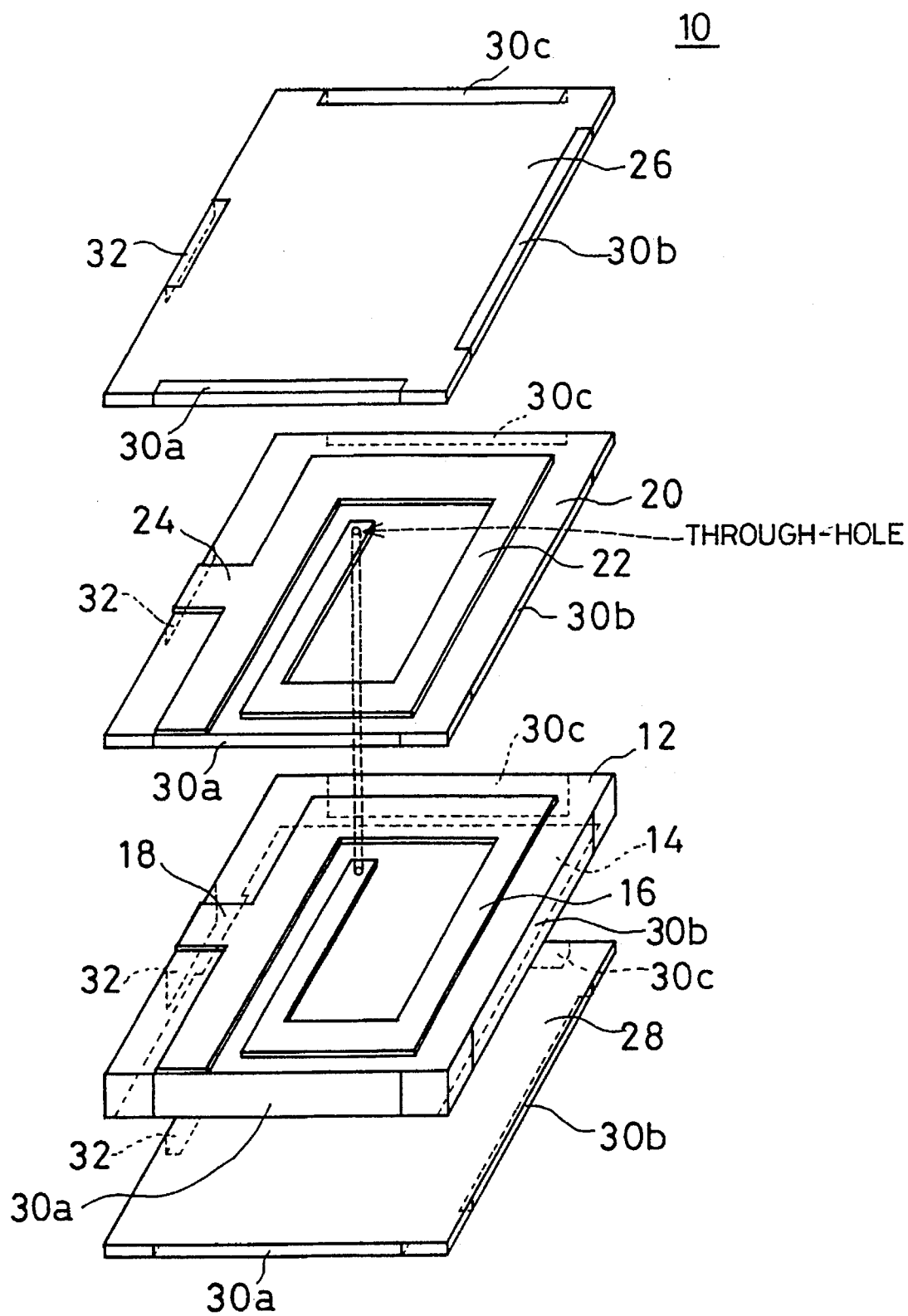
FIG. 3 is an exploded perspective view of the resonator shown in FIG. 1.

FIG. 1 is a plan view showing one example of a resonator according to the present invention, FIG. 2 is a sectional view taken along the line II—II of FIG. 1, FIG. 3 is an exploded perspective view thereof. A resonator 10 includes a first dielectric substrate 12. The first dielectric substrate 12 is formed with, for example, dielectric ceramic in a rectangular plate. A material having, for example, a dielectric constant more than 50 can be used as a material of the first dielectric substrate 12.

An earth electrode 14 is formed almost entirely on one main surface of the first dielectric substrate 12. A spiral first pattern electrode 16 is formed on the other main surface of the first dielectric substrate 12 so as to be opposite to the earth electrode 14. The first pattern electrode 16 is formed so that the width thereof becomes stepwise smaller from the outermost end thereof toward the innermost end thereof. One end of the first pattern electrode 16 is drawn to one end of the first dielectric substrate 12. A first drawing electrode 18 is drawn from the first pattern electrode 16 toward the other end of the first dielectric substrate 12. The first drawing electrode 18 is formed so as to be spaced at a fixed interval from one end of the first pattern electrode 16 drawn to one end of the first dielectric substrate 12.

An insulation layer 20 consisting of, for example, a polyimide layer is formed on the other main surface of the first dielectric substrate 12 so as to cover the first pattern electrode 16 and the first drawing electrode 18. In this case, the insulation layer 20 is formed so as to expose one end face of the first pattern electrode 16 and one end face of the first drawing electrode 18. A second pattern electrode 22 and a second drawing electrode 24 are formed on the insulation layer 20. In this case, the second pattern electrode 22 and the second drawing electrode 24 are formed in the same configuration as that of the first pattern electrode 16 and that of the first drawing electrode 18, respectively, and the insulation layer 20 is sandwiched between the first pattern electrode 16 and the second pattern electrode 22 and between the first drawing electrode 18 and the second drawing electrode 24.

A protecting layer 26 consisting of, for example, glass or resin is formed on the insulation layer 20 so as to cover the second pattern electrode 22 and the second drawing electrode 24. In this case, the protecting layer 26 is formed so as to expose one end face of the second pattern electrode 22 and one end face of the second drawing electrode 24.

A protecting layer 28 consisting of, for example, glass or resin is formed on one main surface of the first dielectric substrate 12 so as to cover the earth electrode 14. In this case, the protecting layer 28 is formed so as to expose the end of the earth electrode 14 excepting the direction to which the first drawing electrode 18 and the second drawing electrode 24 are drawn.

Three terminal electrodes 30a, 30b, and 30c are formed on side faces of the resonator 10. In this case, the terminal electrodes 30a, 30b, and 30c are formed on the side surfaces to which the first drawing electrode 18 and the second drawing electrode 24 are not drawn. The earth electrode 14, one end of the first pattern electrode 16 and one end of the second pattern electrode 22 are connected with each other through the terminal electrode 30a. The terminal electrodes 30b and 30c are connected to the earth electrode 14. A drawing terminal electrode 32 is formed on the side face of the resonator 10 to which the first drawing electrode 18 and the second drawing electrode 24 are drawn. The drawing terminal electrode 32 is connected to the first drawing electrode 18 and the second drawing electrode 24.

Figure 4:
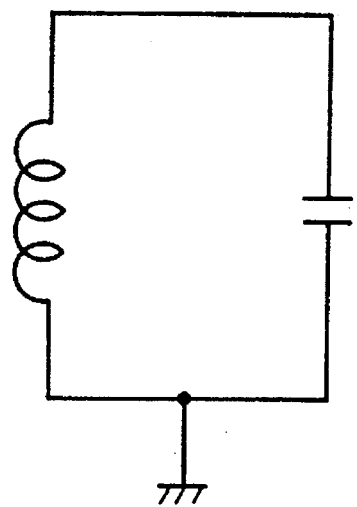
FIG. 4 is an equivalent circuit diagram of the resonator shown in FIG. 1.

The resonator 10 does not have a capacitor pattern formed thereon but has an equivalent circuit shown in FIG. 4. This is because the resonator 10 has a strip line structure and thus an electrostatic capacity is formed between the earth electrode 14 and the first pattern electrode 16 and between the earth electrode 14 and the second pattern electrode 22. The electrostatic capacity can be changed by adjusting the thickness of the first dielectric substrate 12 or that of the insulation layer 20. By changing the electrostatic capacity, the resonance frequency of the resonator 10 can be changed. The electrostatic capacity can be changed by adjusting the dielectric constant of the first dielectric substrate 12, the area of the first pattern electrode 16 or that of the second pattern electrode 22, too.

Figure 17:
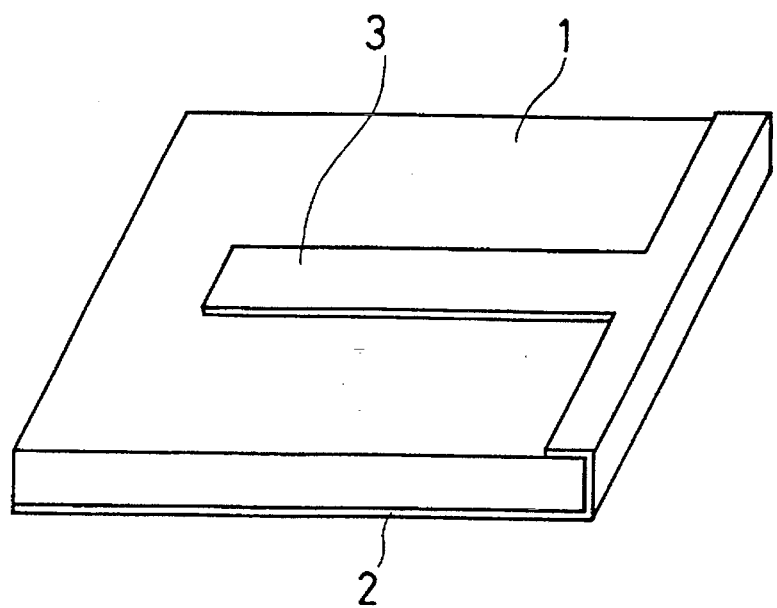
FIG. 17 is a perspective view showing an example of a conventional resonator.

Compared with the resonator shown in FIG. 17, in the resonator 10, since the pattern electrode is spirally formed, the plan configuration is as small as 2.0 mm by 2.0 mm.

Figure 5:
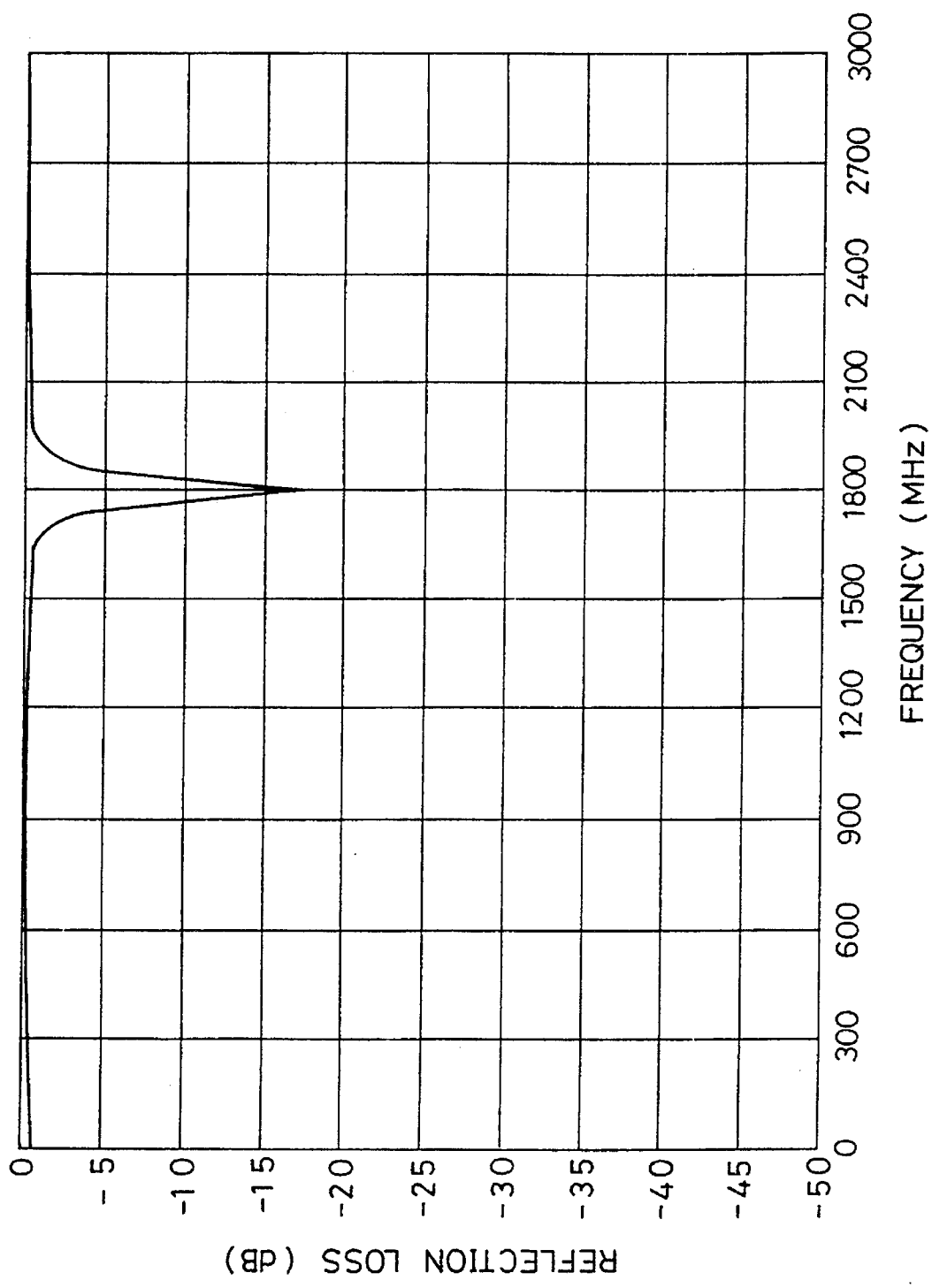
FIG. 5 is a graph showing the frequency characteristic of the resonator shown in FIG. 1.
Figure 19:
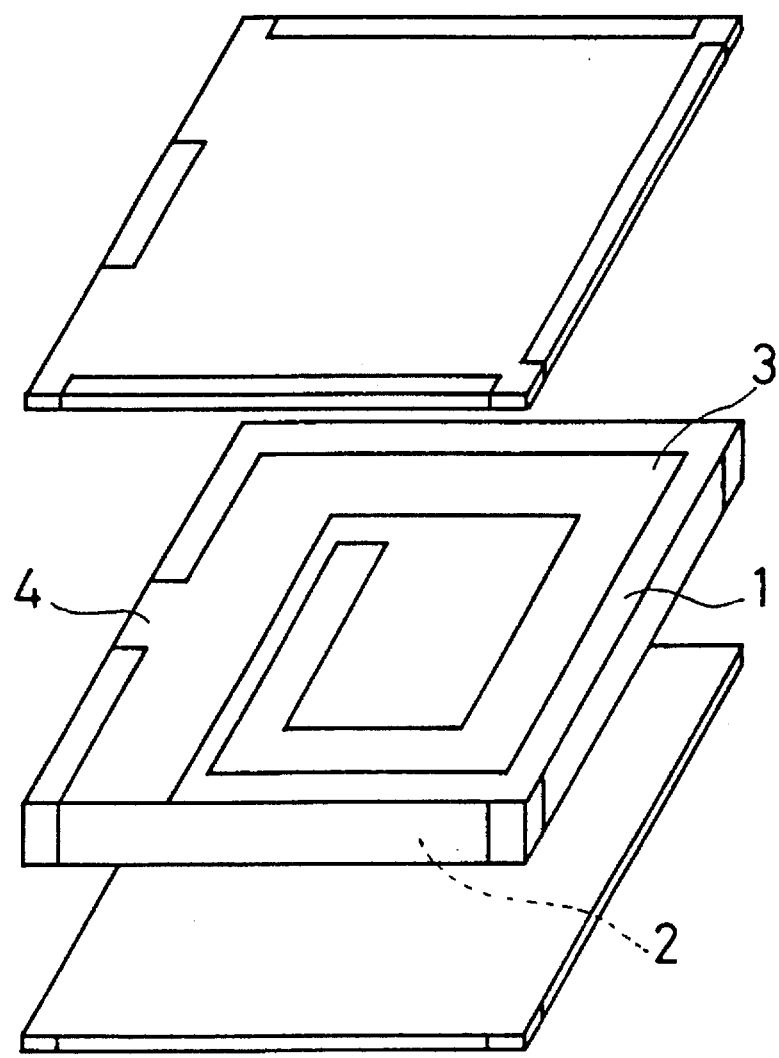
FIG. 19 is an exploded perspective view showing an example of a resonator which is the background of the present invention.
Figure 21:
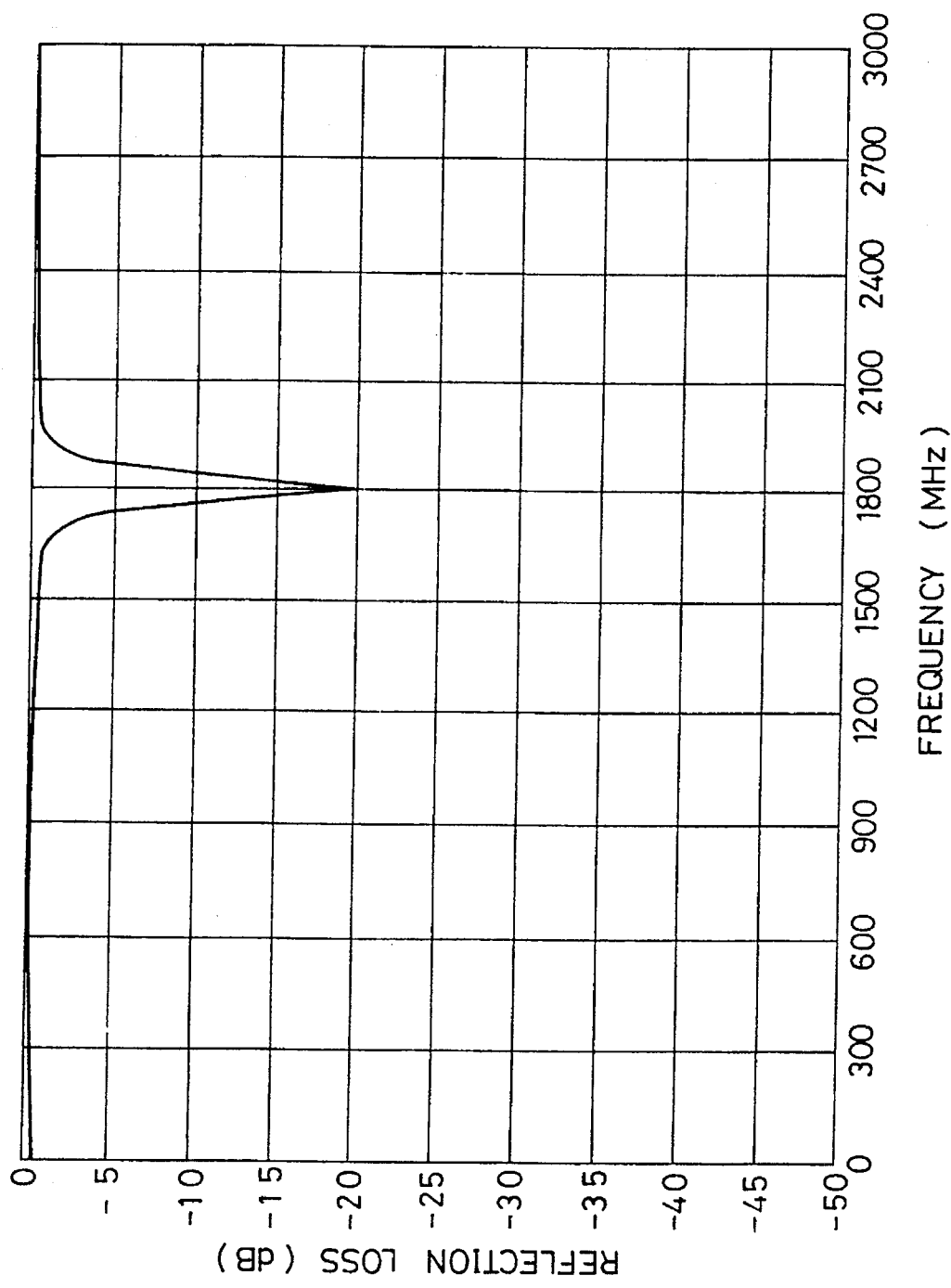
FIG. 21 is a graph showing the frequency characteristic of the resonator shown in FIG. 19.

Further, compared with the resonator shown in FIG. 19 having the same configuration with that of the resonator 10, in the resonator 10, since the pattern electrodes are formed in two layers sandwiching the insulation layer therebetween, the surface area of the pattern electrodes is increased, the resistance component of the pattern electrodes is decreased, and Q becomes large. More specifically, in the resonator shown in FIG. 19, the resonance frequency is 1800 MHz and Q is 92, whereas in the resonator 10, the resonance frequency is 1798 MHz and Q is 103. That is, the Q of the resonator 10 is higher than that of the resonator shown in FIG. 19 by approximately 10%, although the former has the same plan configuration as that of the latter. The frequency characteristic of the resonator 10 is shown in FIG. 5, and the frequency characteristic of the resonator shown in FIG. 19 is shown in FIG. 21.

The impedance of the resonator 10 is determined by the interval between one end of the first pattern electrode 16 and the first drawing electrode 18 and also the interval between one end of the second pattern electrode 22 and the second drawing electrode 24. Thus, the impedance of the resonator 10 can be changed by adjusting the intervals and can be matched easily with that of an external circuit.

In order to manufacture the resonator 10, the first dielectric substrate 12 is prepared. An electrode film is formed on one main surface of the first dielectric substrate 12 by a thin film-forming method, and the electrode film is etched by using photo-resist and so on, thereby the first pattern electrode 16 and the first drawing electrode 18 are formed with high accuracy. Then, thermoplastic polyimide is placed, printed or coated on the surface of the first dielectric substrate 12 on which the first pattern electrode 16 and so on have been formed, thereby the insulation layer 20 is formed. The second pattern electrode 22 and the second drawing electrode 24 are formed on the insulation layer 20 with high accuracy in a method similar to that of forming the first pattern electrode 16 and the first drawing electrode 18. The earth electrode 14 is formed almost entirely on the back surface of the first dielectric substrate 12 by the thin film-forming method. The protecting layers 26 and 28 are formed on the surface of the insulation layer 20 on which the second pattern electrode 22 and so on have been formed and the surface of the first dielectric substrate 12 on which the earth electrode 14 has been formed, respectively by using glass or resin. Then, the terminal electrodes 30a, 30b and 30c and the drawing terminal electrode 32 are formed, thereby the resonator 10 is manufactured.

In order to manufacture the resonator 10 in a large quantity, pattern electrodes of a plurality of the resonators 10 are formed on one large dielectric substrate by printing, coating or the like, and then, the large dielectric substrate is cut. When manufacturing the resonator 10 in a large quantity in the above-mentioned method, cost and labor for forming the pattern electrodes of the resonators 10 can be reduced, the resonator 10 can be manufactured at a low cost.

It is possible to manufacture the resonator 10 by laminating a plurality of dielectric green sheets and sintering them uniformly. However, the above-mentioned method, for manufacturing the resonator 10, comprising the process of forming the pattern electrodes on the dielectric substrate is reliable, compared with the sintering method which may cause layers to be separated from each other, products to be cracked, broken or chipped.

The above-mentioned method of forming the resonator 10 by laminating a plurality of dielectric green sheets and sintering them uniformly has a disadvantage that the variation in the size of the resonators 10 is great due to the contraction coefficient of layers during sintering, which leads to a great variation in the resonance frequency of the resonators 10. Consequently, the above sintering method necessitates adjusting process such as trimming process. Compared with the sintering method, the above-mentioned method for manufacturing the resonator 10 is advantageous, because the method improves size accuracy outstandingly, and the variation in the size of the resonator 10 and the resonance frequency thereof is less than 1.5%. Thus, the method eliminates the need for adjusting process such as trimming process.

Figure 6:
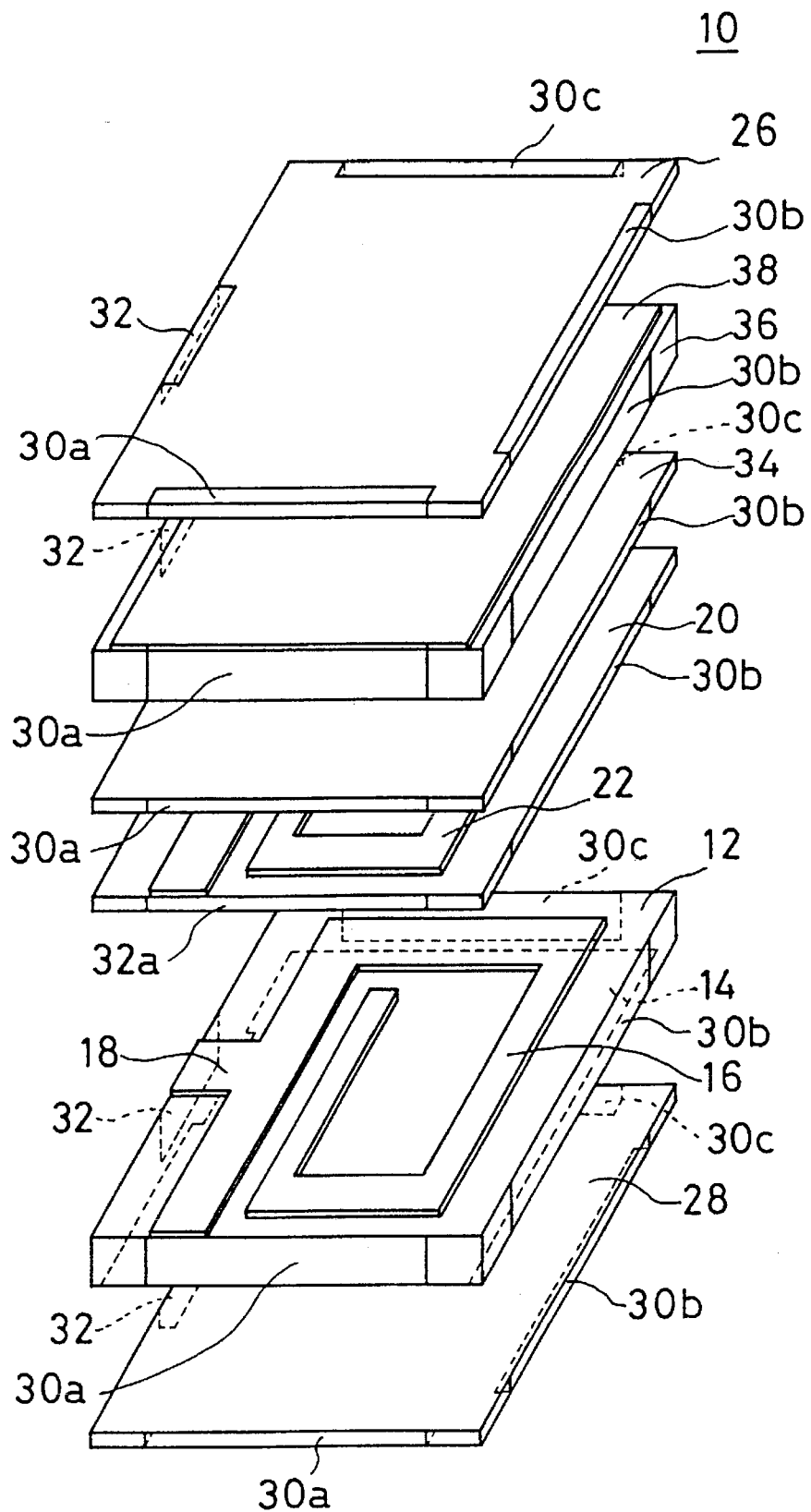
FIG. 6 is an exploded perspective view showing another example of a resonator according to the present invention.

FIG. 6 is an exploded perspective view showing another example of a resonator according to the present invention. In the resonator shown in FIG. 6, compared with the resonator shown in FIG. 1 through FIG. 4, an adhesive layer 34 consisting of, for example, a polyimide layer, a second dielectric substrate 36 having a dielectric constant lower than that of the first dielectric substrate 12, and a shield electrode 38 are formed between the insulation layer 20 and the protecting layer 26.

The adhesive layer 34 is formed on the insulation layer 20 so as to cover the second pattern electrode 22 and the second drawing electrode 24. In this case, similarly to the protecting layer 26 formed in the resonator shown in FIG. 1 through FIG. 4, the adhesive layer 34 is formed so as to expose one end face of the second pattern electrode 22 and one end face of the second drawing electrode 24. The second dielectric substrate 36 is formed on the adhesive layer 34. The shield electrode 38 is formed almost entirely on the second dielectric substrate 36. The protecting layer 26 is formed on the second dielectric substrate 36 so as to cover the shield electrode 38. In this case, the protecting layer 26 is formed so as to expose the end of the shield electrode 38 excepting the direction to which the first drawing electrode 18 and the second drawing electrode 24 are drawn. The shield electrode 38 is connected to the terminal electrodes 30a, 30b, and 30c.

In order to manufacture the resonator shown in FIG. 6, for example, similarly to the method of manufacturing the resonator shown in FIG. 1 through FIG. 4, the earth electrode 14, the first pattern electrode 16, the first drawing electrode 18, the insulation layer 20, the second pattern electrode 22, and the second drawing electrode 24 are formed on the first dielectric substrate 12. Further, the second dielectric substrate 36 is prepared and the shield electrode 38 is formed on the second dielectric substrate 36 by the thin film-forming method. Thermoplastic polyimide to form the adhesive layer 34 is placed, printed or coated on the face of the insulation layer 20 on which the second pattern electrode 22 and so on are formed. Thereafter, the second dielectric substrate 36 is laminated on the surface of the thermoplastic polyimide applied. Then, the insulation layer 20, the thermoplastic polyimide applied, and the second dielectric substrate 36 are heated and pressed or heated and pressed in vacuum, thereby the second dielectric substrate 36 is bonded by the adhesive layer 34 to the insulation layer 20. Thereafter, the protecting layers 26 and 28 are formed by using glass or resin. Then, the terminal electrodes 30a, 30b, and 30c and the drawing terminal electrode 32 are formed. In this manner, the resonator shown in FIG. 6 is manufactured.

In the resonator shown in FIG. 6, effects similar to that provided by the resonator shown in FIG. 1 through FIG. 4 are provided, and in addition, the pattern electrodes and so on are electromagnetically shielded from the outside by the shield electrode 38.

Figure 7:
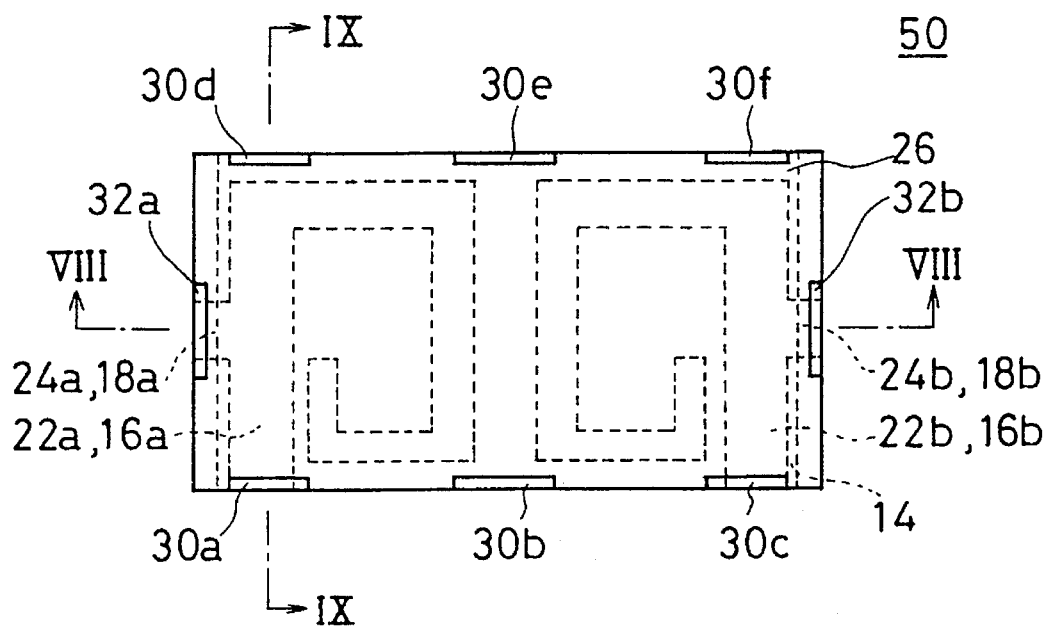
FIG. 7 is a plan view showing one example of a chip type filter according to the present invention.
Figure 8:
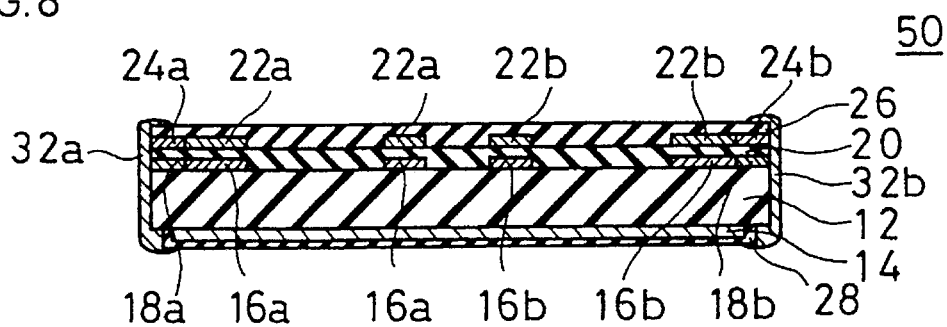
FIG. 8 is a sectional view taken along the line VIII—VIII of FIG. 7.
Figure 9:
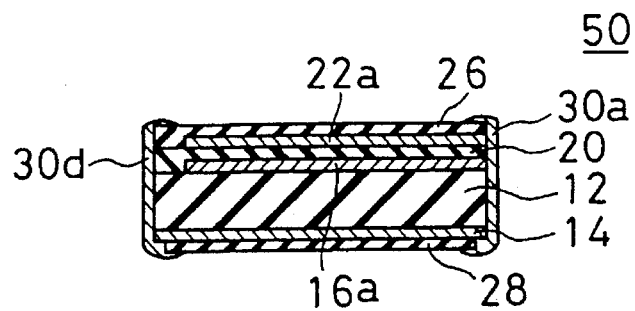
FIG. 9 is a sectional view taken along the line IX—IX of FIG. 7.
Figure 10:
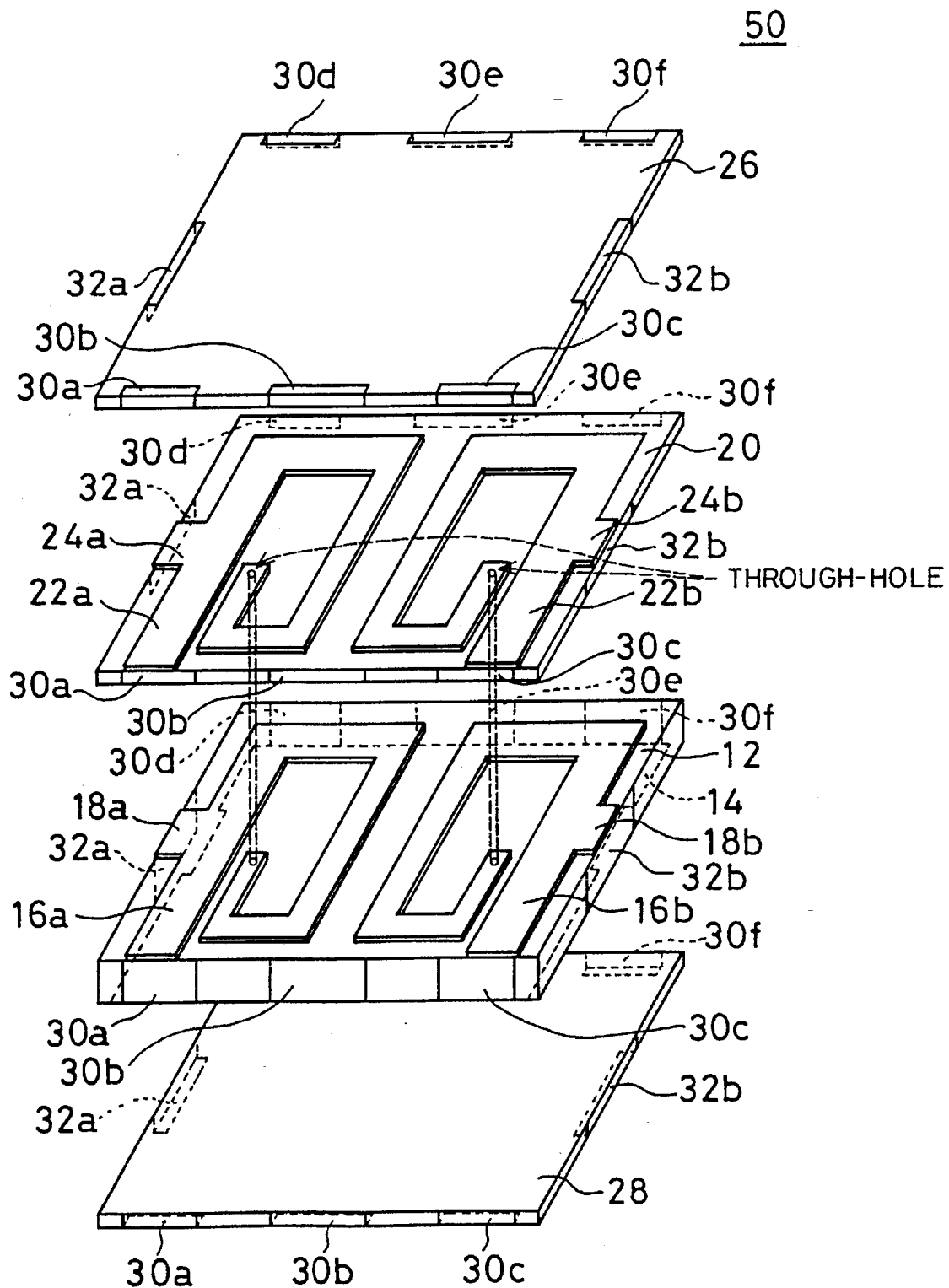
FIG. 10 is an exploded perspective view of the chip type filter shown in FIG. 7.

FIG. 7 is a plan view showing one example of a chip type filter according to the present invention, FIG. 8 is a sectional view taken along the line VIII—VIII of FIG. 7, FIG. 9 is a sectional view taken along the line IX—IX of FIG. 7, FIG. 10 is an exploded perspective view thereof. A chip type filter 50 has a construction similar to that formed by connecting the resonator 10 shown in FIG. 1 through FIG. 4 and a resonator having inner electrodes reverse to the inner electrodes of the resonator 10. That is, the chip filter 50 includes a first dielectric substrate 12. The first dielectric substrate 12 is formed with, for example, dielectric ceramic in a rectangular plate. A material having, for example, a dielectric constant more than 50 can be used as a material of the first dielectric substrate 12.

An earth electrode 14 is formed almost entirely on one main surface of the first dielectric substrate 12. Spiral first pattern electrodes 16a and 16b which are line-symmetrical are formed on the other main surface of the first dielectric substrate 12 so as to be opposite to the earth electrode 14 and be electromagnetically connected with each other. The first pattern electrodes 16a and 16b are formed so that the width of the each of the first pattern electrodes 16a and 16b becomes stepwise smaller from the outermost end of thereof toward the innermost end of thereof. One end of each of the first pattern electrodes 16a and 16b is drawn to one end of the first dielectric substrate 12. A first drawing electrode 18a is drawn from the first pattern electrode 16a toward one end of the dielectric substrate 12, while a first drawing electrode 18b is drawn from the first pattern electrode 16b toward the other end of the dielectric substrate 12. Each of the first drawing electrodes 18a and 18b is formed so as to be spaced at a fixed interval from one end of each of the first pattern electrodes 16a and 16b drawn to one end of the first dielectric substrate 12.

An insulation layer 20 consisting of, for example, a polyimide layer is formed on the other main surface of the first dielectric substrate 12 so as to cover the first pattern electrodes 16a and 16b and the first drawing electrodes 18a and 18b. In this case, the insulation layer 20 is formed so as to expose end faces of the first pattern electrodes 16a and 16b and end faces of the first drawing electrodes 18a and 18b. Second pattern electrodes 22a and 22b and second drawing electrodes 24a and 24b are formed on the insulation layer 20. In this case, the second pattern electrodes 22a and 22b are formed in the same configuration as that of the first pattern electrodes 16a and 16b, and the second drawing electrodes 24a and 24b are formed in the same configuration as that of the first drawing electrodes 18a and 18b. The insulation layer 20 is sandwiched between the first pattern electrode 16a and the second pattern electrode 22a, between the first pattern electrode 16b and the second pattern electrode 22b, between the first drawing electrode 18a and the second drawing electrode 24a, and between the first drawing electrode 18b and the second drawing electrode 24b. Thus, the second pattern electrodes 22a and 22b are electromagnetically connected with each other.

A protecting layer 26 consisting of, for example, glass or resin is formed on the insulation layer 20 so as to cover the second pattern electrodes 22a and 22b and the second drawing electrodes 24a and 24b. In this case, the protecting layer 26 is formed so as to expose end faces of the second pattern electrodes 22a and 22b and end faces of the second drawing electrodes 24a and 24b.

A protecting layer 28 consisting of, for example, glass or resin is formed on one main surface of the first dielectric substrate 12 so as to cover the earth electrode 14. In this case, the protecting layer 28 is formed so as to expose the end face of the earth electrode 14 excepting the directions to which the drawing electrodes 18a, 18b, 24a and 24b are formed.

Six terminal electrodes 30a, 30b, 30c, 30d, 30e and 30f are formed on side faces, of the chip filter 50, opposed to each other. In this case, the terminal electrodes 30a through 30f are formed on the side surfaces to which the drawing electrodes 18a, 18b, 24a and 24b are not formed. The earth electrode 14, one end of the first pattern electrode 16a and one end of the second pattern electrode 22a are connected with each other through the terminal electrode 30a. Similarly, the earth electrode 14, one end of the first pattern electrode 16b and one end of the second pattern electrode 22b are connected with each other through the terminal electrode 30c. The other terminal electrodes 30b, 30d, 30e and 30f are connected to the earth electrode 14.

Drawing terminal electrodes 32a and 32b are formed on the side face of the chip type filter 50 to which the drawing electrodes 18a and 24a are drawn. The drawing terminal electrode 32a is connected to the first drawing electrode 18a and the second drawing terminal 24a, whereas the drawing terminal electrode 32b is connected to the first drawing electrode 18b and the second drawing electrode 24b.

Figure 11:
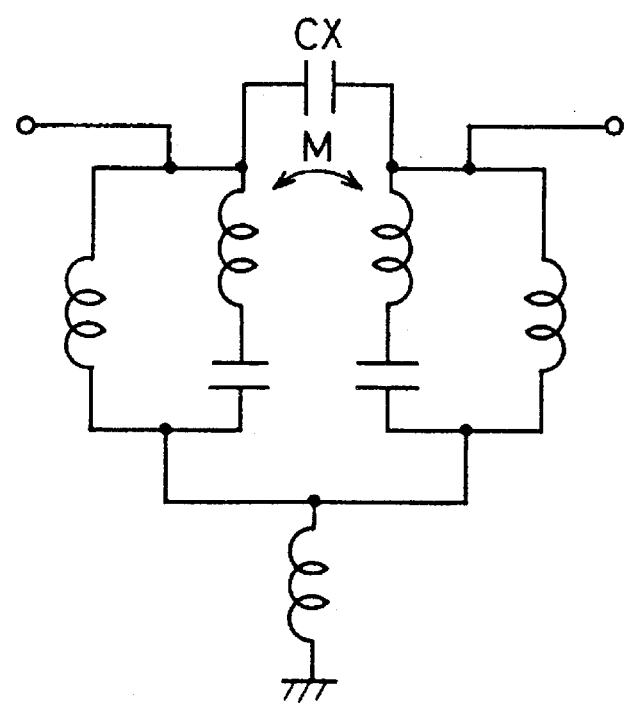
FIG. 11 is an equivalent circuit diagram of the chip type filter shown in FIG. 7.

The chip type filter 50 does not have a capacitor pattern formed thereon but has an equivalent circuit shown in FIG. 11, similarly to the resonator shown in FIG. 1 through FIG. 4. In the equivalent circuit shown in FIG. 11, reference symbols CX and M indicate an electromagnetic connection. As understood from the above description, the chip type filter 50 is constituted by the electromagnetical connection between the two resonators. Therefore, the center frequency and the pass band of the chip type filter 50 can be changed by adjusting the thickness of the first dielectric substrate 12 or that of the insulation layer 20. The center frequency and the pass band can be also changed by adjusting the dielectric constant of the first dielectric substrate 12, the area of the first electrodes 16a and 16b or the area of the second pattern electrodes 22a and 22b.

Figure 18:
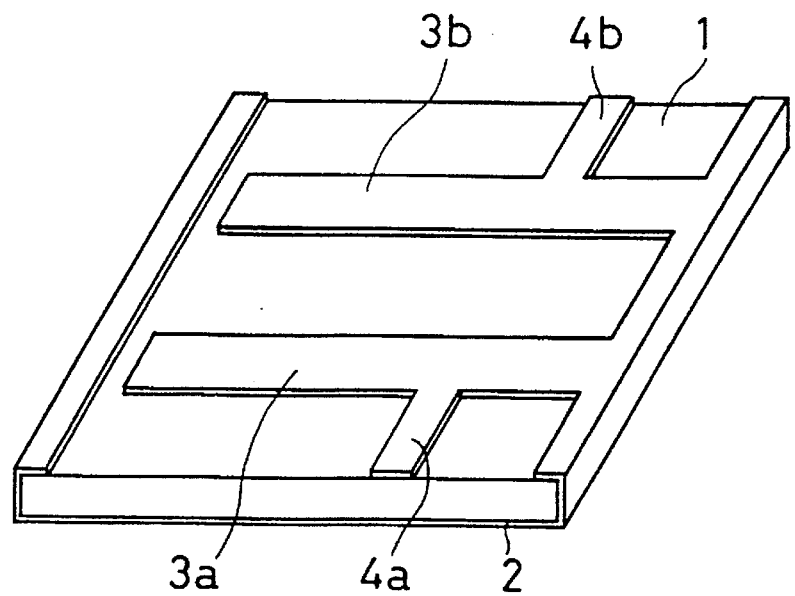
FIG. 18 is a perspective view showing an example of a conventional chip type filter.

Compared with the chip type filter shown in FIG. 18, in the chip type filter 50, since the pattern electrodes are spirally formed, the plan configuration is as small as 2.5 mm by 3.2 mm.

Figure 12:
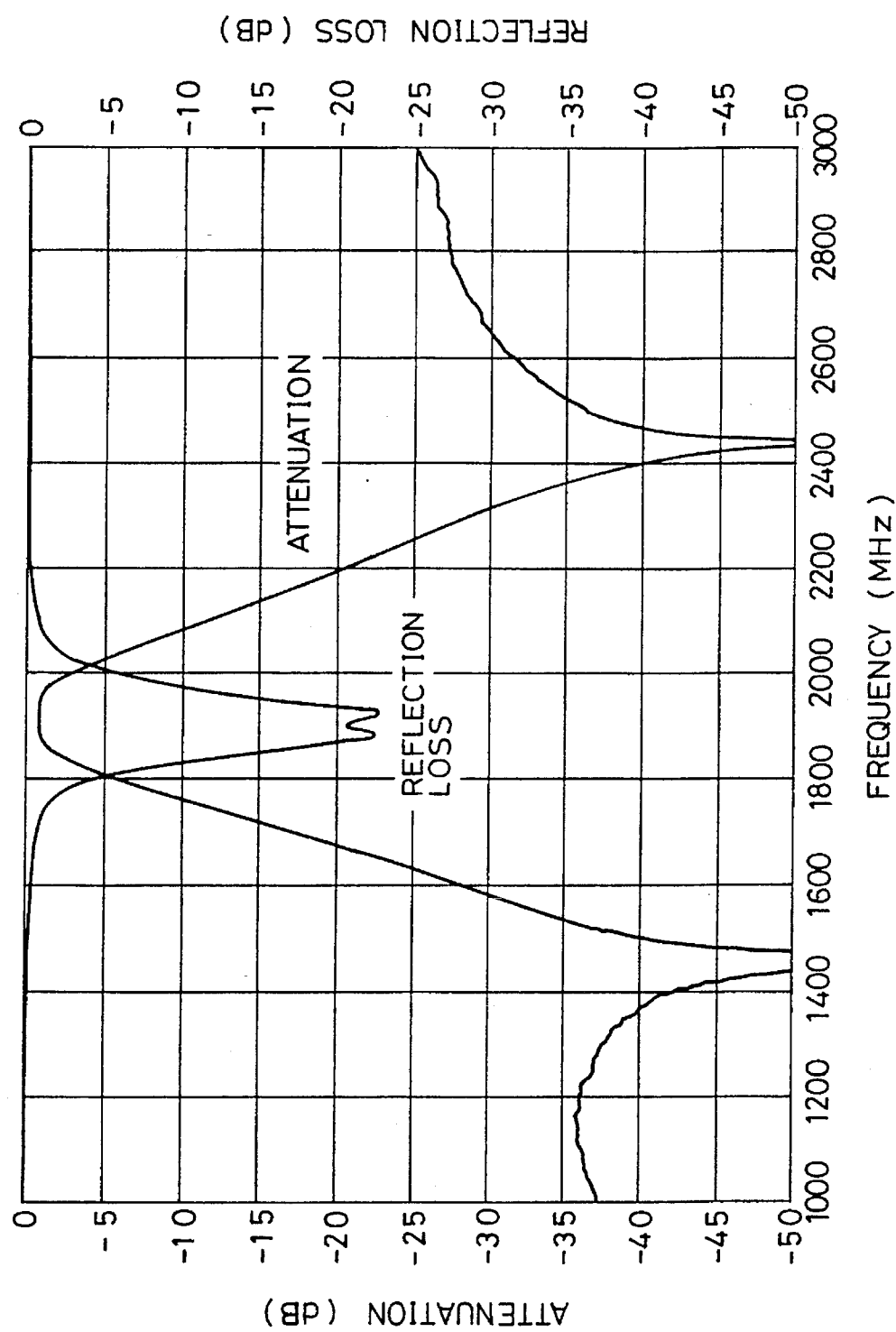
FIG. 12 is a graph showing the frequency characteristic of the chip type filter shown in FIG. 7.
Figure 20:
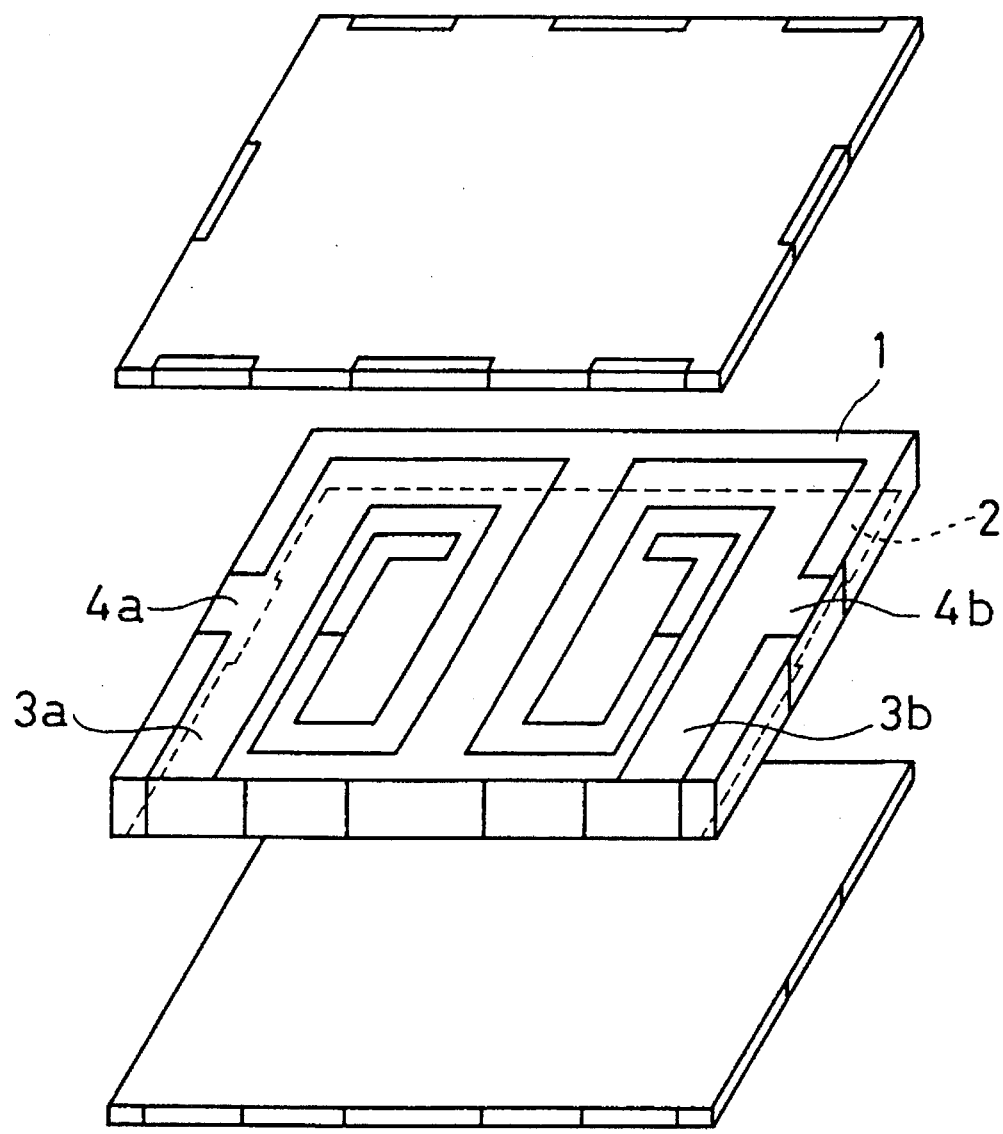
FIG. 20 is an exploded perspective view showing an example of a chip type filter which is the background of the present invention.
Figure 22:
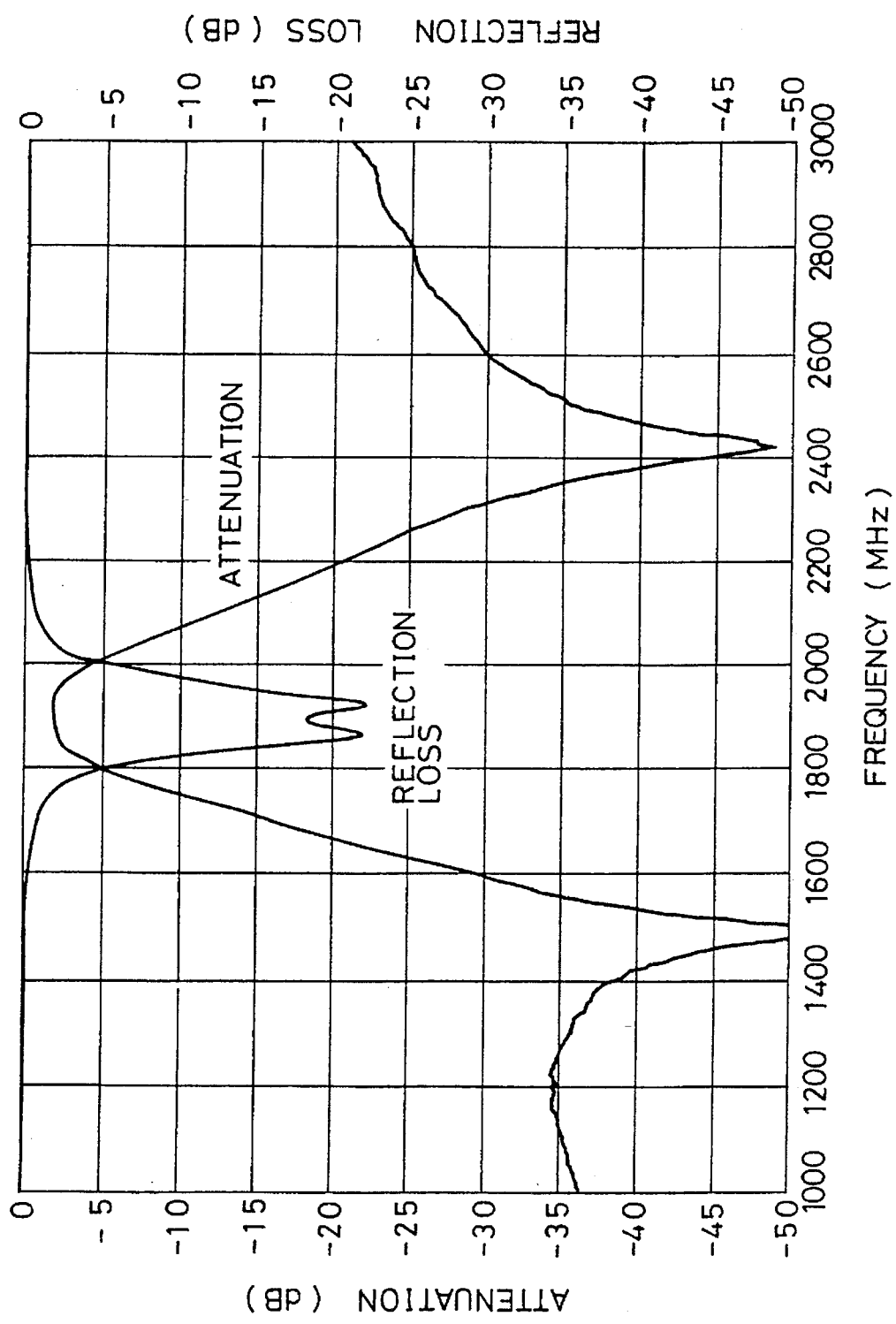
FIG. 22 is a graph showing the frequency characteristic of the chip type filter shown in FIG. 20.

Further, compared with the chip type filter shown in FIG. 20 having the same configuration with that of the chip type filter 50, in the chip type filter 50, since the pattern electrodes are formed in two layers sandwiching the insulation layer therebetween, the surface area of the pattern electrodes is increased, the resistance component of the pattern electrodes is decreased, and Q becomes high. More specifically, in the chip type filter shown in FIG. 20, the resonance frequency is 1900 MHz, attenuation band width of 3 dB is 203.6 MHz, insertion loss is 1.8 dB, and attenuation amount is 43.5 dB at a frequency lower than the resonance frequency by 480 MHz, whereas in the chip type filter 50, the resonance frequency is 1910 MHz, attenuation band width of 3 dB is 210.0 MHz, insertion loss is 1.4 dB, and attenuation amount is 46.7 dB at a frequency lower than the resonance frequency by 480 MHz. That is, the Q of the chip type filter 50 is higher than that of the chip type filter shown in FIG. 20, and the insertion loss of the former is lower than that of the latter by about 0.4 dB, although the former has the same plan configuration as that of the latter. The frequency characteristic of the chip type filter 50 is shown in FIG. 12, and the frequency characteristic of the chip type filter shown in FIG. 20 is shown in FIG. 22.

The impedance of the chip type filter 50 is determined by the interval between one end of the first pattern electrode 16a and the first drawing electrode 18a and the interval between the first pattern electrode 16b and the first drawing electrode 18b, and the interval between one end of the second pattern electrode 22a and the second drawing electrode 24a, and the interval between the second pattern electrode 22b and the second drawing electrode 24b. Thus, the impedance of the chip type filter 50 can be changed by adjusting the intervals and can be matched easily with that of an external circuit.

The chip type filter 50 is manufactured by, for example, a method similar to that of manufacturing the resonator 10 shown in FIG. 1 through FIG. 4.

Accordingly, the chip type filter 50 can be manufactured at a low cost similarly to the resonator 10 shown in FIG. 1 through FIG. 4.

The above-mentioned method, of manufacturing the chip type filter 50, comprising the process of forming the pattern electrodes on the dielectric substrate is more favorable than the method of forming it by laminating dielectric green sheets and sintering them uniformly, because in the latter method, there is a possibility that layers are separated from each other, products are cracked, broken or chipped.

The above-mentioned method for manufacturing the chip type filter 50 is advantageous because the method improves size accuracy outstandingly, and the variation in the size of the chip type filter 50 and the resonance frequency thereof is less than 1.0%. Thus, the method eliminates the need for adjusting process such as trimming process.

Figure 13:
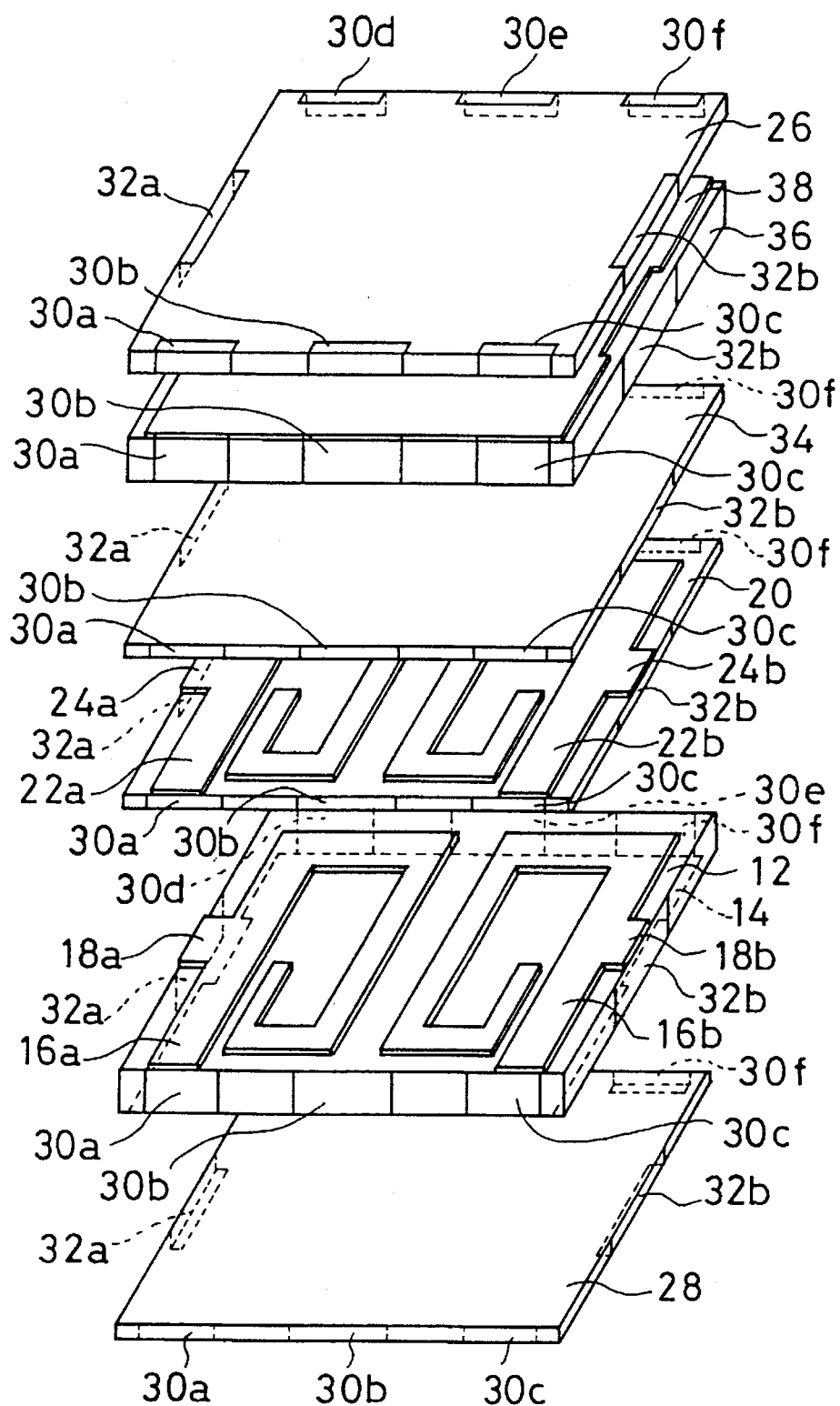
FIG. 13 is an exploded perspective view showing another example of a chip type filter according to the present invention.
Figure 14:
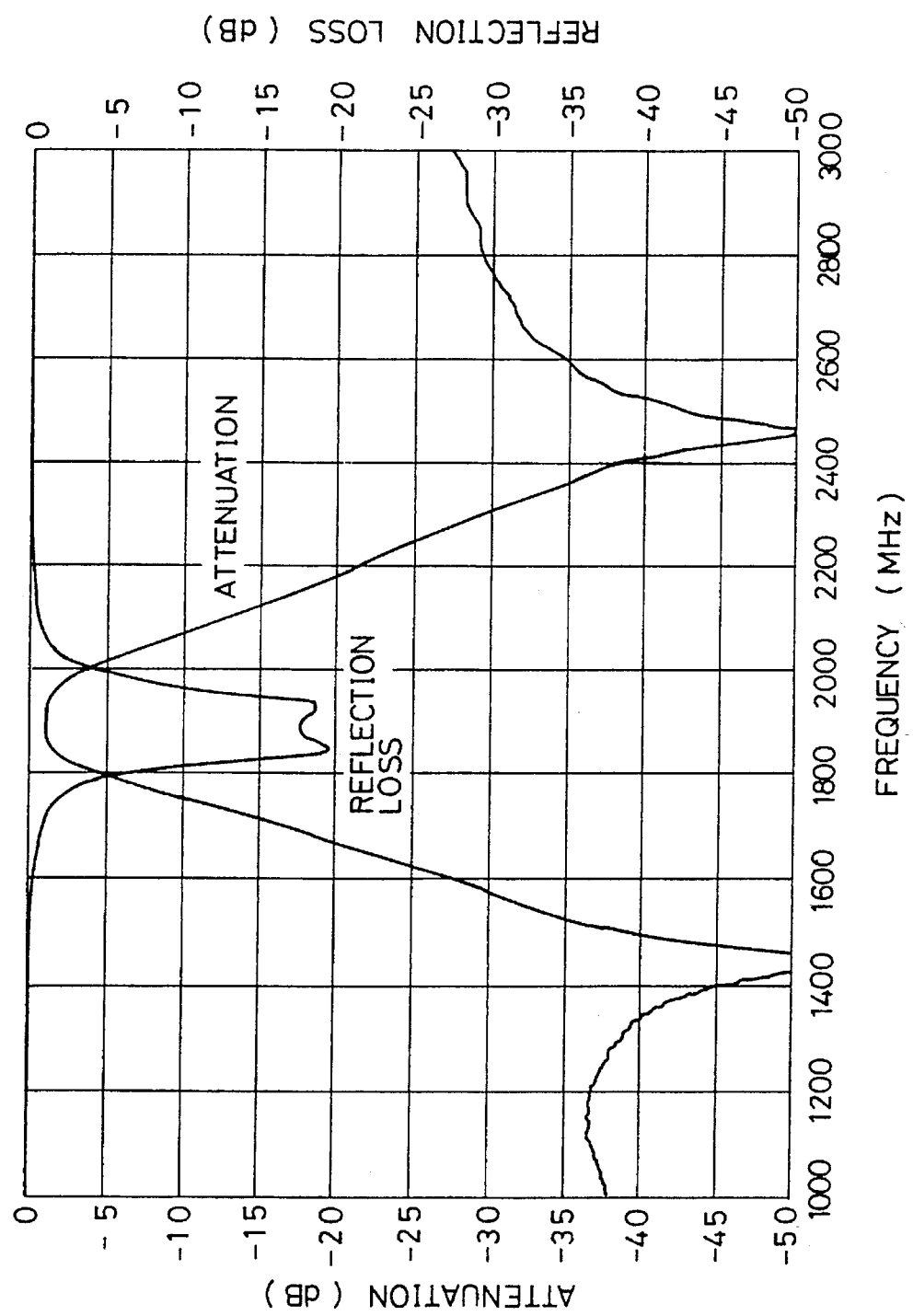
FIG. 14 is a graph showing the frequency characteristic of the chip type filter shown in FIG. 13.

FIG. 13 is an exploded perspective view showing another example of a chip type filter according to the present invention. A chip type filter 50 shown in FIG. 13 has a construction similar to that formed by connecting the resonator 10 shown in FIG. 6 and a resonator having inner electrodes reverse to the inner electrodes of the resonator 10. Compared with the chip type filter shown in FIG. 7 though FIG. 11, in the chip type filter shown in FIG. 13, an adhesive layer 34 consisting of, for example, a polyimide layer, a second dielectric substrate 36 having a dielectric constant lower than that of the first dielectric substrate 12, and a shield electrode 38 are formed between the insulation layer 20 and the protecting layer 26.

The adhesive layer 34 is formed on the insulation layer 20 so as to cover the second pattern electrodes 22a and 22b and the second drawing electrodes 24a and 24b. In this case, similarly to the protecting layer 26 formed in the chip type filter shown in FIG. 7 through FIG. 11, the adhesive layer 34 is formed so as to expose end faces of the second pattern electrodes 22a and 22b and end faces of the second drawing electrodes 24a and 24b. The second dielectric substrate 36 is formed on the adhesive layer 34. The shield electrode 38 is formed almost entirely on the second dielectric substrate 36. The protecting layer 26 is formed on the second dielectric substrate 36 so as to cover the shield electrode 38. In this case, the protecting layer 26 is formed so as to expose the end of the shield electrode 38 excepting the direction to which the drawing electrodes 18a, 18b, 24a, and 24b are drawn. The shield electrode 38 is connected to the terminal electrodes 30a through 30f.

The chip type filter 50 shown in FIG. 13 is manufactured by, for example, a method similar to that of manufacturing the resonator 10 shown in FIG. 6.

In the chip type filter 50 shown in FIG. 13, effects similar to that provided by the chip type filter shown in FIG. 7 through FIG. 11 are provided, and in addition, the pattern electrodes and so on are electromagnetically shielded from the outside by the shield electrode 38.

Figure 15:
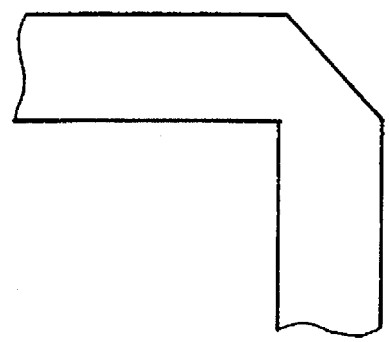
FIG. 15 is an illustrative view showing a modification of a bending portion of a pattern electrode.
Figure 16:
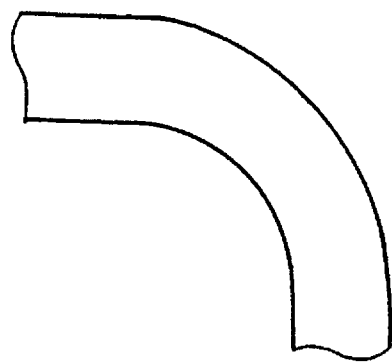
FIG. 16 is an illustrative view showing another modification of a bending portion of a pattern electrode.

In each of the above-mentioned embodiments, the pattern electrodes are bent perpendicularly at a plurality of points. In order to improve standing wave ratio in a high frequency band, the outer side of bending portions of each pattern electrode may be diagonally formed as shown in FIG. 15 or the bending portions may be formed in a circular arc configuration as shown in FIG. 16. Further, the pattern electrodes may be zigzag or straight. In addition, the pattern electrodes may have the same width from one end to the other end thereof.

In each of the above-mentioned embodiments, the pattern electrodes are formed in two layers so as to sandwich the insulation layer therebetween. But they may be formed in three or more layers so as to sandwich each insulation layer therebetween.

The construction in which pattern electrodes are layered one on the other differentiates the effective dielectric constants of resonators from each other due to the different electrical lengths of the respective pattern electrode. Thus, in order to equalize the respective pattern electrodes to each other, it is preferable to adjust the electrical lengths of the respective pattern electrodes by varying the widths thereof, the lengths thereof or the thicknesses thereof or by changing the dispositions thereof. In this case, preferably, the width of the pattern electrode closest to the first dielectric substrate is set to be greatest of those of all the pattern electrodes. In order to allow a pass band to be wide, it is possible to differentiate the electrical lengths of the respective pattern electrodes from each other by forming them in the same size.

The Q can be increased by the electromagnetic connection between the respective electrodes even though they are not electrically connected with each other. The Q can be increased further by electrically connecting at least one portion of the pattern electrode disposed on the earth electrode side, at least one portion of the pattern electrode on the open side, and at least one portion of the pattern electrode on the input/output side with each other via a through-hole formed in the insulation layer provided between the respective electrodes. Further, the difference between the electrical lengths of the respective pattern electrodes can be reduced by electrically connecting portions, of the pattern electrodes, at the open sides thereof with each other via the through-hole formed in the insulation layer. In order to prevent the electrical lengths of the respective pattern electrodes from being different from each other even in a slight degree, it is favorable to electrically connect the portions, of the pattern electrodes, at the open sides thereof with each other via the through-hole formed in the insulation layer.

It will be apparent from the foregoing that, while the present invention has been described in detail and illustrated, these are only particular illustrations and examples, and the present invention is not limited to these. The spirit and scope of the present invention is limited only by the appended claims.

What is claimed is:

1. A λ/4 resonator comprising:

a center electrode, said center electrode comprising a pair of pattern electrodes having respective corresponding shapes sandwiching exclusively insulative material including at least one insulation layer therebetween, one end of each of said pattern electrodes being connected to an earth electrode, and the other end of each of said pattern electrodes being open; and a pair of drawing electrodes connected respectively to said pair of pattern electrodes, said pair of drawing electrodes being electrically connected to each other.

2. A resonator according to claim 1, which further comprises a dielectric substrate; and an earth electrode formed on one main surface of said dielectric substrate, wherein said pattern electrodes are formed on the other main surface of said dielectric substrate.

3. A resonator according to claim 2, which further comprises a shield electrode for electromagnetically shielding said pattern electrodes from the outside.

4. A resonator according to claim 3, wherein said pattern electrodes are spirally formed.

5. A resonator according to claim 2, wherein said pattern electrodes are spirally formed.

6. A $\lambda/4$ resonator according to claim 1, wherein the open ends of said pattern electrodes are connected to each other via a through-hole formed through said at least one sandwiched insulation layer.

* * * * *